(12) United States Patent
Nagahara et al.

(10) Patent No.: US 12,445,122 B2
(45) Date of Patent: Oct. 14, 2025

(54) SEMICONDUCTOR DEVICE

(71) Applicant: Mitsubishi Electric Corporation, Tokyo (JP)

(72) Inventors: Teruaki Nagahara, Tokyo (JP); Kosuke Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 73 days.

(21) Appl. No.: 18/581,866

(22) Filed: Feb. 20, 2024

(65) Prior Publication Data

US 2024/0429913 A1 Dec. 26, 2024

(30) Foreign Application Priority Data

Jun. 22, 2023 (JP) ................................. 2023-102261

(51) Int. Cl.
*H03K 17/00* (2006.01)
*H03K 17/14* (2006.01)

(52) U.S. Cl.
CPC .................................. *H03K 17/145* (2013.01)

(58) Field of Classification Search
CPC ... H03K 17/145; H03K 17/127; H02M 1/088; H02M 1/0038; H02M 1/327; H01L 23/28; H01L 23/535; H01L 25/07
See application file for complete search history.

(56) References Cited

U.S. PATENT DOCUMENTS

| | | | |
|---|---|---|---|
| 9,735,771 B1* | 8/2017 | Lu ....................... | H03K 17/6871 |
| 10,644,689 B2* | 5/2020 | Shinomiya ............. | H03K 17/06 |
| 11,515,868 B2* | 11/2022 | Sato .................. | H03K 17/08122 |
| 2013/0062626 A1* | 3/2013 | Takao .................. | H10D 84/035 |
| | | | 257/77 |
| 2019/0386652 A1* | 12/2019 | Korner ................ | H03K 17/122 |
| 2025/0038737 A1* | 1/2025 | Nagahara .............. | H03K 3/011 |

FOREIGN PATENT DOCUMENTS

JP 6544316 B2 7/2019

* cited by examiner

*Primary Examiner* — Tuan T Lam
(74) *Attorney, Agent, or Firm* — Studebaker Brackett PLLC

(57) ABSTRACT

An object is to provide a technique capable of suppressing heat occurring in a second semiconductor switching element. A semiconductor device includes a parallel circuit in which a first semiconductor switching element and a second semiconductor switching element are parallelly connected and a gate drive circuit. When a state continuing time which is a time during which the state of the input signal continues is equal to or larger than a threshold value, the gate drive circuit turns off the second semiconductor switching element while keeping ON of the first semiconductor switching element, or reduces a power conduction capability of the second semiconductor switching element while keeping ON of the first semiconductor switching element.

8 Claims, 14 Drawing Sheets

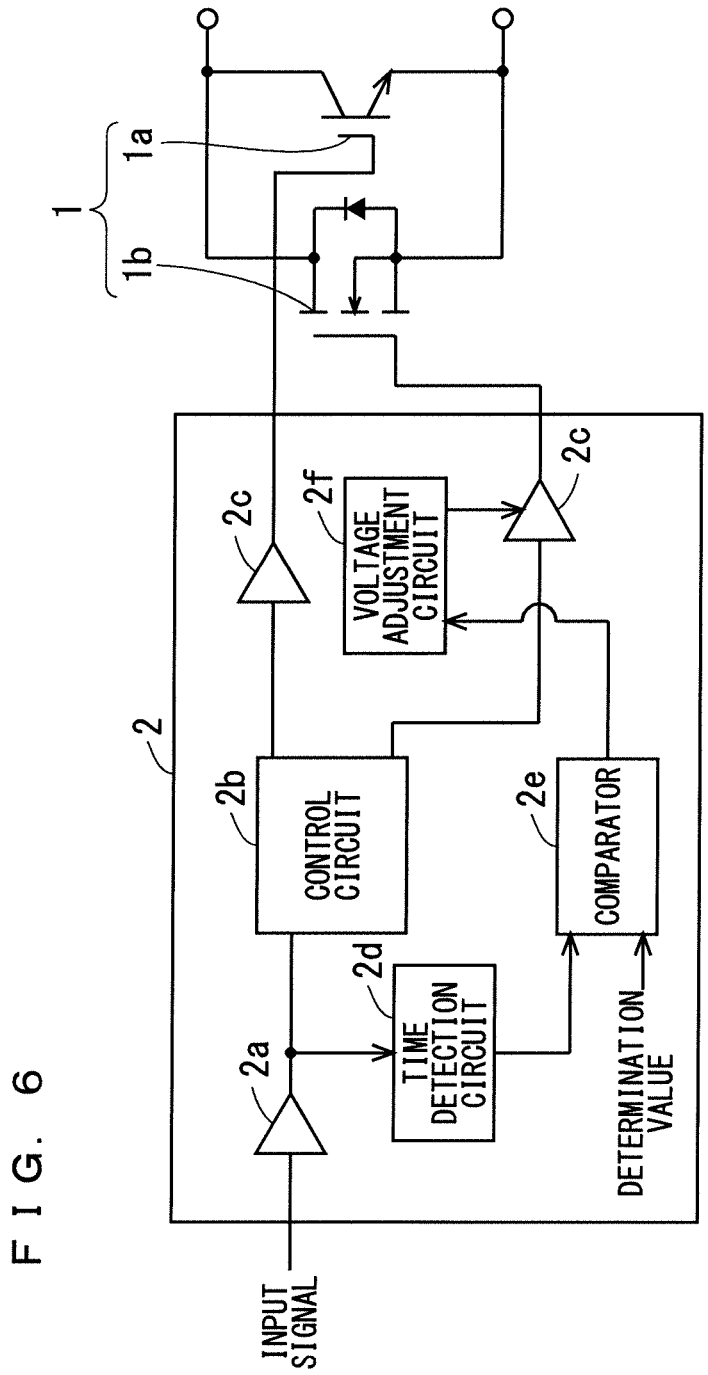
F I G. 6

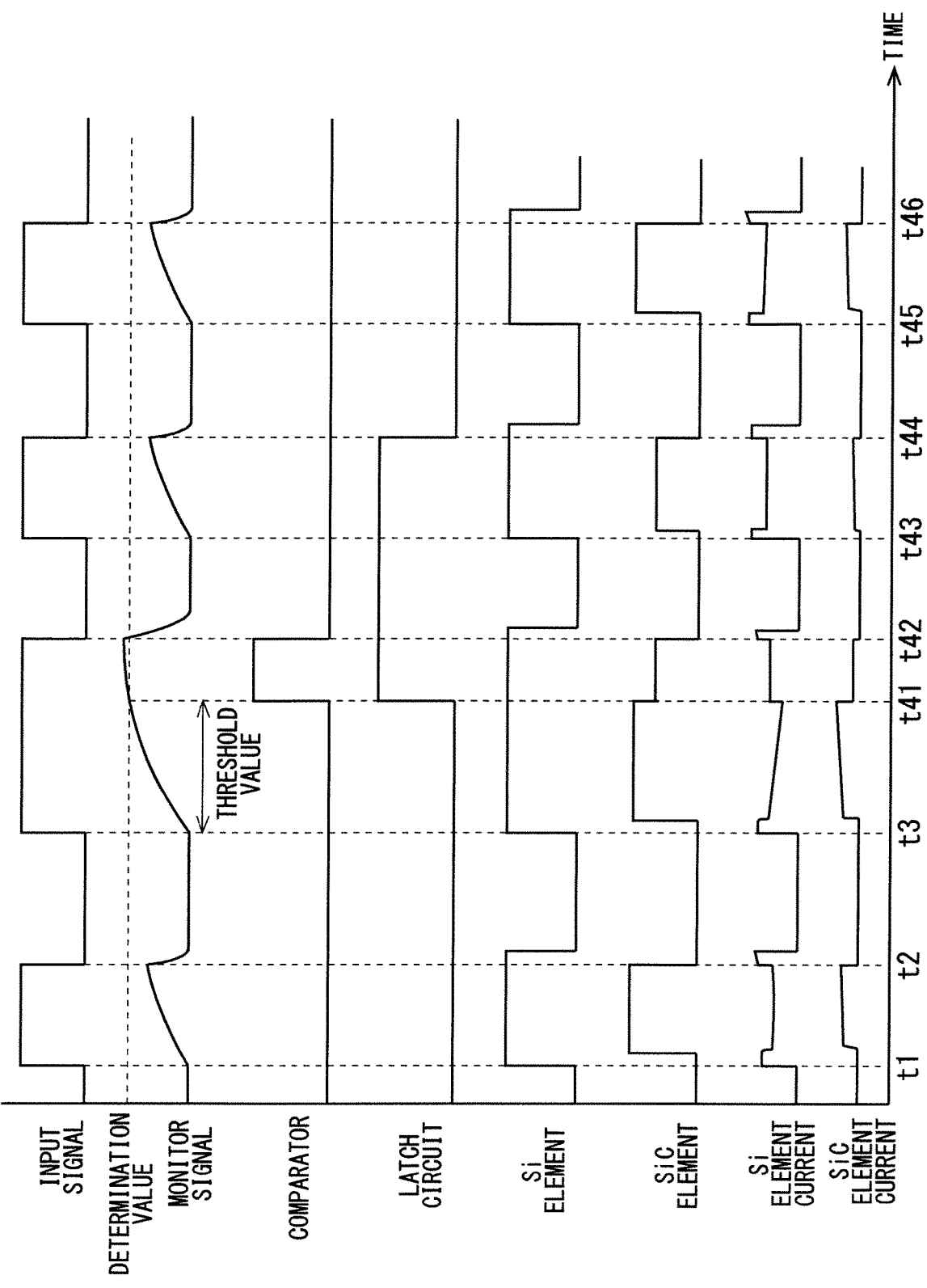

SEMICONDUCTOR DEVICE

BACKGROUND OF THE INVENTION

Field of the Invention

The present disclosure relates to a semiconductor device.

Description of the Background Art

Conventionally, an insulated gate bipolar transistor (IGBT) and a metal oxide semiconductor field effect transistor (MOSFET) made of inexpensive silicon (Si) are generally used as a power element of an inverter device for driving a motor, for example. In the meanwhile, in recent years, there are increasing opportunities of using a high-efficient power element made of silicon carbide (SiC) or gallium nitride (GaN) as a wide bandgap (WBG) semiconductor.

However, the WBG semiconductor is expensive, thus does not become common in a value-oriented consumer apparatus, for example. Proposed accordingly is usage of a parallel circuit made up of a small-sized SiC-MOSFET and Si-IGBT parallelly connected to each other for long-time usage at low current in a drive motor of a compressor in a home air-conditioner, for example. Expected according to such manufactures is reduction in cost caused by downsizing of the SiC-MOSFET and improvement of efficiency (that is to say, reduction of loss) caused by favorable DC characteristics at low current in the SiC-MOSFET.

An air conditioner can be generally operated at low current when it takes a certain time after being activated and a room temperature becomes stable. In the meanwhile, when a rapid change of a room temperature is necessary at a time of starting activation of the air conditioner, for example, current in a drive motor in a compressor increases, and accordingly, current flowing in an SiC element also increases. Thus, when the DC characteristics of the SiC element is excessively improved, current flowing in the SiC element excessively increases and high heat occurs at a time of increasing current in the motor. The high heat may cause a defect in the SiC element such as the SiC-MOSFET having low heat radiation properties due to a downsized configuration.

Thus, Japanese Patent No. 6544316 proposes a technique of turning off an SiC element or reducing gate voltage of the SiC element when a temperature and current of a parallel circuit are detected and are equal to or larger than threshold values, respectively.

SUMMARY

However, there is a problem that a size and cost of a semiconductor increase when a temperature detection circuit and a current detection circuit are provided to the semiconductor device for a small-sized home electrical appliance provided with a power element with a high density.

The present disclosure is made in consideration of the above problems, and an object of the present disclosure is to provide a technique capable of suppressing heat occurring in a second semiconductor switching element such as an SiC element without providing a temperature detection circuit and a current detection circuit.

A semiconductor device according to the present disclosure includes: a parallel circuit in which a first semiconductor switching element and a second semiconductor switching element having a larger bandgap than the first semiconductor switching element are parallelly connected; and a gate drive circuit capable of changing a time of continuing a state of ON of the first semiconductor switching element and the second semiconductor switching element based on the state of ON or OFF of an input signal. When a state continuing time which is a time during which the state of the input signal continues is equal to or larger than a threshold value, the gate drive circuit turns off the second semiconductor switching element while keeping ON of the first semiconductor switching element, or reduces a power conduction capability of the second semiconductor switching element while keeping ON of the first semiconductor switching element.

Heat occurring in the second semiconductor switching element can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram illustrating a configuration of a semiconductor device according to an embodiment 2.

FIG. 14 is a timing chart illustrating an operation of the semiconductor device according to the embodiment 5.

DESCRIPTION OF THE PREFERRED EMBODIMENTS

Figure 1:
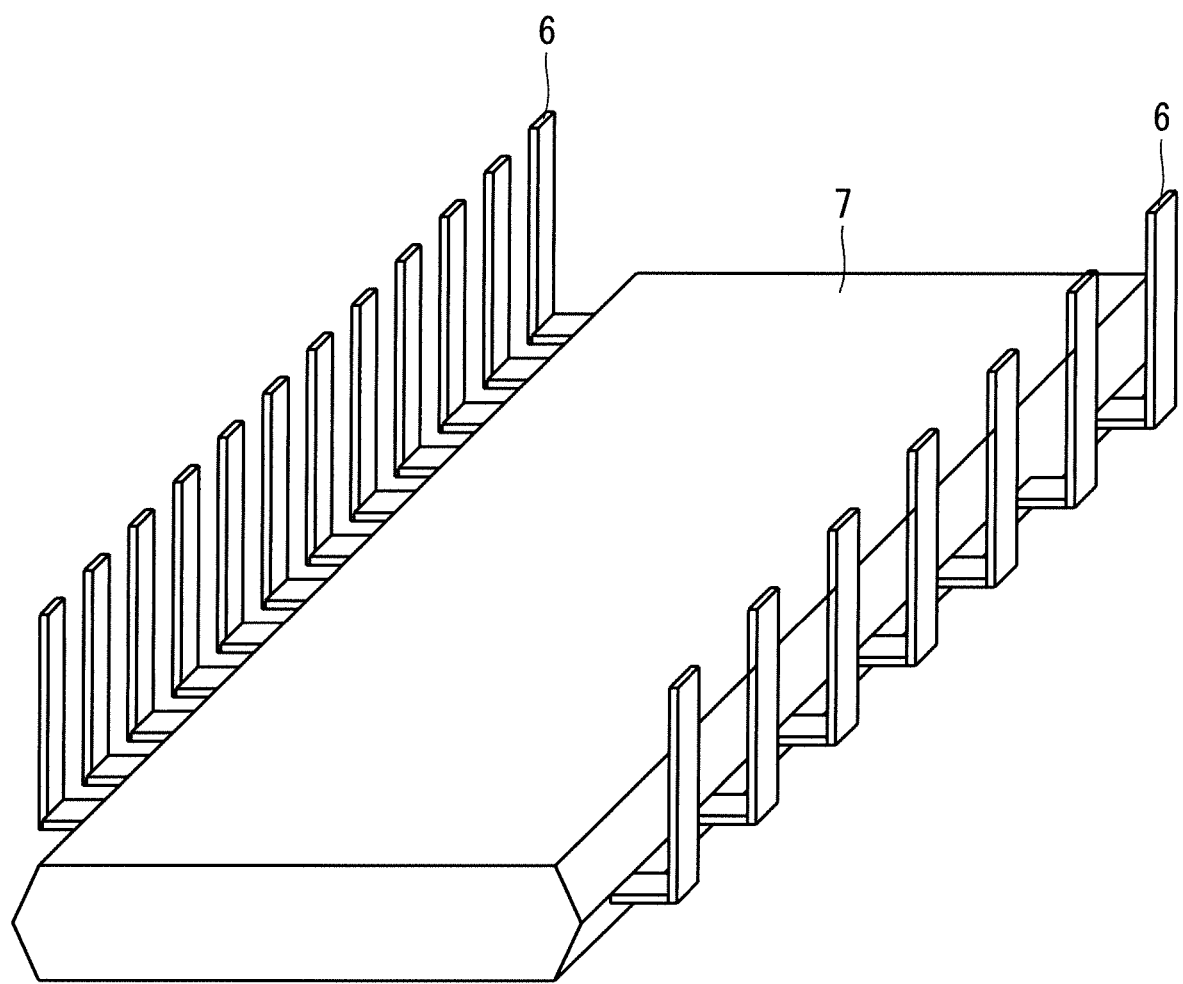
FIG. 1 is a perspective view illustrating an outer configuration of a semiconductor device according to an embodiment 1.

Embodiments are described with reference to the appended diagrams hereinafter. Features described in each embodiment described below is exemplification, thus all features are not necessarily applied. The same or similar reference numerals will be assigned to similar constituent elements in a plurality of embodiments in the description hereinafter, and the different constituent elements are mainly described hereinafter.

Embodiment 1

Figure 2:
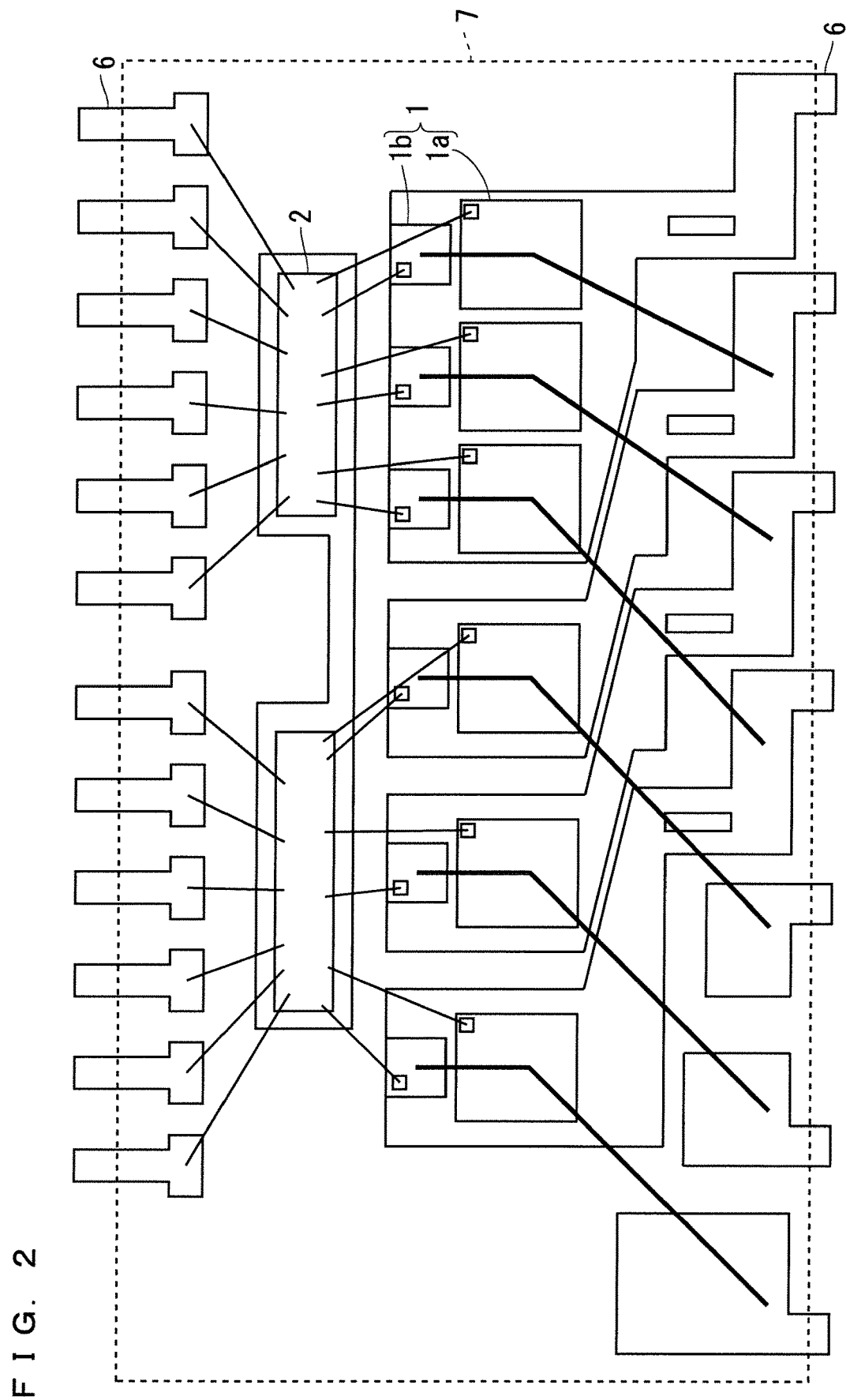
FIG. 2 is a plan view illustrating an inner configuration of the semiconductor device according to the embodiment 1.

FIG. 1 is a perspective view illustrating an outer configuration of a semiconductor device according to the present embodiment 1, and FIG. 2 is a plan view illustrating an inner configuration of the semiconductor device. As illustrated in FIG. 2, the semiconductor device according to the present embodiment 1 includes a parallel circuit 1, a gate drive circuit 2, a lead frame 6, and a sealing member 7.

The parallel circuit 1 includes a first semiconductor switching element and a second switching element, and the first semiconductor switching element and the second semiconductor switching element are parallelly connected to each other.

In the present embodiment 1, the first semiconductor switching element is an Si element 1a made of silicon (Si). In the description hereinafter, the Si element 1a is an IGBT, but is not limited to the IGBT. The Si element 1a may be a reverse conducting-IGBT (RC-IGBT) or a MOSFET.

In the present embodiment 1, the second semiconductor switching element is an SiC element 1b made of silicon carbide (SiC). It is sufficient that the second semiconductor switching element has a larger bandgap than the first semiconductor switching element, thus the second semiconductor switching element may be an element made of a wide bandgap (WBG) semiconductor such as GaN or diamond, for example. The SiC element 1b made of SiC can improve efficiency, that is to say, it can reduce loss.

In the description hereinafter, the SiC element 1b is a MOSFET in which the loss is reduced particularly at low current and an effect is easily obtained, however, the configuration is not limited thereto. The SiC element 1b may also be the IGBT, for example. A size of the SiC element 1b is preferably smaller than that of the Si element 1a from a viewpoint of cost of a semiconductor device.

The gate drive circuit 2 is connected to a gate terminal of the Si element 1a and the SiC element 1b, and controls gate voltage of the Si element 1a and the SiC element 1b to control ON and OFF of the Si element 1a and the SiC element 1b.

Figure 3:
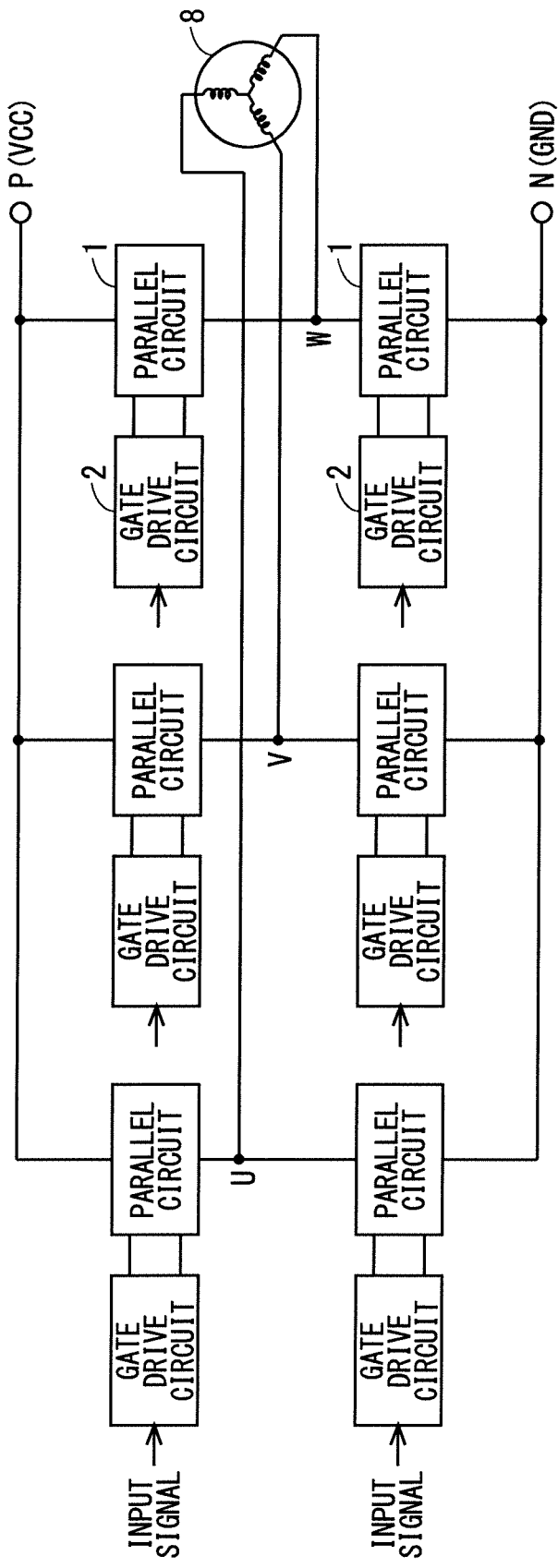
FIG. 3 is a diagram illustrating an application example of the semiconductor device according to the embodiment 1.

The number of the parallel circuits 1 in FIG. 2 is six, and the number of the gate drive circuits 2 is two, however, the configuration is not limited thereto. For example, as illustrated in FIG. 3, it is applicable that six parallel circuits 1 and six gate drive circuits 2 are connected to a drive motor 8 driving a compressor of a home electrical appliance such as an air conditioner to constitute a three-phase motor drive circuit. Description hereinafter is an example of a configuration that one gate drive circuit 2 is provided to one parallel circuit 1 for convenience of description.

As illustrated in FIG. 2, the lead frame 6 is electrically connected to the parallel circuit 1 and the gate drive circuit 2. As illustrated in FIG. 1 and FIG. 2, the sealing member 7 covers the parallel circuit 1, the gate drive circuit 2, and the lead frame 6 while exposing a part of the lead frame 6.

Figure 4:
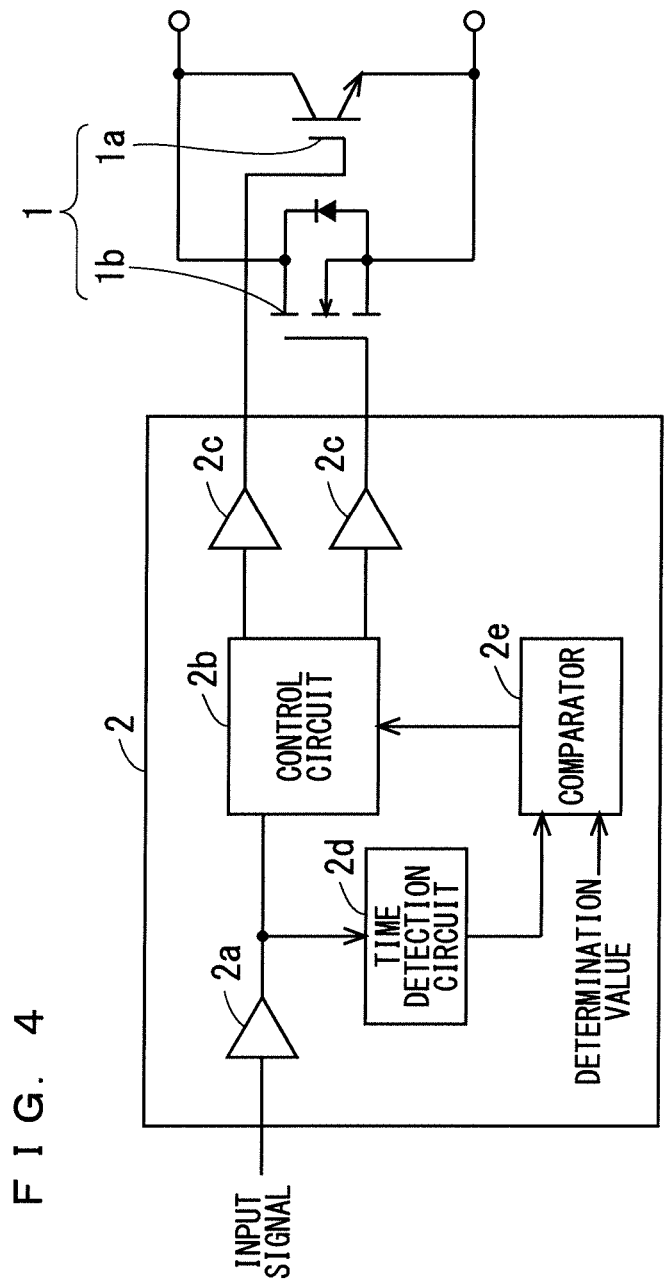
FIG. 4 is a diagram illustrating a configuration of the semiconductor device according to the embodiment 1.

FIG. 4 is a diagram illustrating a configuration of the semiconductor device according to the present embodiment 1, and is specifically a diagram illustrating configurations of the parallel circuit 1 and the gate drive circuit 2 according to the present embodiment 1 in detail.

A collector terminal and emitter terminal of the Si element 1a and a drain terminal and source terminal of the SiC element 1b are connected to each other, respectively, to constitute the parallel circuit 1.

It is preferable to improve DC characteristics of the SiC element 1b by reducing on resistance of the SiC element 1b as much as possible, for example, to reduce the loss at a time of flowing low current to the parallel circuit 1. A method of reducing the on resistance of the SiC element 1b includes a method of increasing a size of the SiC element 1b and a method of changing an element structure and a process adjustment such as changing a gate structure of the SiC element 1b from a planar type to a trench type, for example. Manufacturing cost, for example, increases in the method of increasing the size of the SiC element 1b, thus the method of changing the element structure and the process adjustment is preferable.

However, when the DC characteristics of the SiC element 1b is excessively improved, high heat occurs in the SiC element 1b at a time of starting activation of an air conditioner, for example, and a defect may occur in the SiC element 1b. In contrast, according to the gate drive circuit 2 according to the present embodiment 1 described hereinafter, such problems can be solved.

An outline of the gate drive circuit 2 is described before the detailed description thereof. An input signal selectively having ON and OFF is inputted from an external controller not shown in the diagrams to the gate drive circuit 2. The external controller can change a state continuing time which is a time during which the ON state or the OFF state of input signal continues. In the description hereinafter, the state continuing time is an ON continuing time which is a time during which the ON state of the input signal continues. However, it is also applicable that ON and OFF of the input signal is switched in the description hereinafter, and in such a case, the state continuing time may be an OFF continuing time which is a time during which the OFF state of the input signal continues.

The external controller may be included in the semiconductor device.

The gate drive circuit 2 basically turns on the Si element 1a and the SiC element 1b when the input signal is ON, and turns off the Si element 1a and the SiC element 1b when the input signal is OFF. The ON continuing time of the input signal can be changed, thus the gate drive circuit 2 having such a configuration can change a time of continuing ON of the Si element 1a and the SiC element 1b based on the ON state of the input signal. However, when the ON continuing time is equal to or larger than a threshold value, the gate drive circuit 2 turns off the SiC element 1b while keeping ON of the Si element 1a.

Details of the gate drive circuit 2 is described next. The gate drive circuit 2 includes a buffer circuit 2a, a control circuit 2b, a buffer circuit 2c, a time detection circuit 2d, and a comparator 2e. Each of the buffer circuits 2a and 2c, the control circuit 2b, the time detection circuit 2d, and the comparator 2e is a logic circuit.

The buffer circuit 2a keeps a logical value of an input of the input signal, and outputs the input signal.

When the input signal inputted via the buffer circuit 2a is switched to ON, the control circuit 2b turns on the SiC element 1b after turning on the Si element 1a, and when the input signal is switched to OFF, the control circuit 2b turns off the Si element 1a after turning off the SiC element 1b. That is to say, the control circuit 2b makes a temporal difference between ON of the Si element 1a and ON of the SiC element 1b, and makes a temporal difference between OFF of the Si element 1a and OFF of the SiC element 1b. Accordingly, the current flowing in only the Si element 1a which has been firstly turned on is branched to the SiC element 1b at a ratio corresponding to a difference of the DC characteristics between the elements.

The buffer circuit 2c controls gate voltage of the Si element 1a and the SiC element 1b so that the gate voltage thereof is equal to or larger than threshold value voltage of the Si element 1a and the SiC element 1b when the control circuit 2b turns on the Si element 1a and the SiC element 1b.

The time detection circuit 2d generates a monitor signal in which the voltage corresponds to the ON continuing time of the input signal based on the input signal inputted via the buffer circuit 2a. An integration circuit such as an RC circuit generating the voltage corresponding to the ON continuing time, for example, is used for the time detection circuit 2d.

The comparator 2e compares voltage corresponding to the ON continuing time of a monitor signal and a determination value corresponding to a threshold value, thereby determining whether or not the ON continuing time is equal to or larger than the threshold value. The comparator 2e outputs the output signal, which is different between a case where the ON continuing time is equal to or larger than the threshold value and a case where the ON continuing time is not equal to or larger than the threshold value, to the control circuit 2b. A comparator, for example, is used for the comparator 2e.

The control circuit 2b keeps ON of the Si element 1a and the SiC element 1b when receiving the output signal in the case where the ON continuing time is not equal to or larger than the threshold value from the comparator 2e. In the meanwhile, the control circuit 2b turns off the SiC element 1b while keeping ON of the Si element 1a when receiving the output signal in the case where the ON continuing time is equal to or larger than the threshold value from the comparator 2e. Accordingly, when the ON continuing time is equal to or larger than the threshold value, current in the Si element 1a increases, however, current substantially does not flow in the SiC element 1b. Thus, increase in a temperature due to a power conduction of the SiC element 1b is suppressed, thus a defect of the SiC element 1b due to heat can be suppressed.

Figure 5:
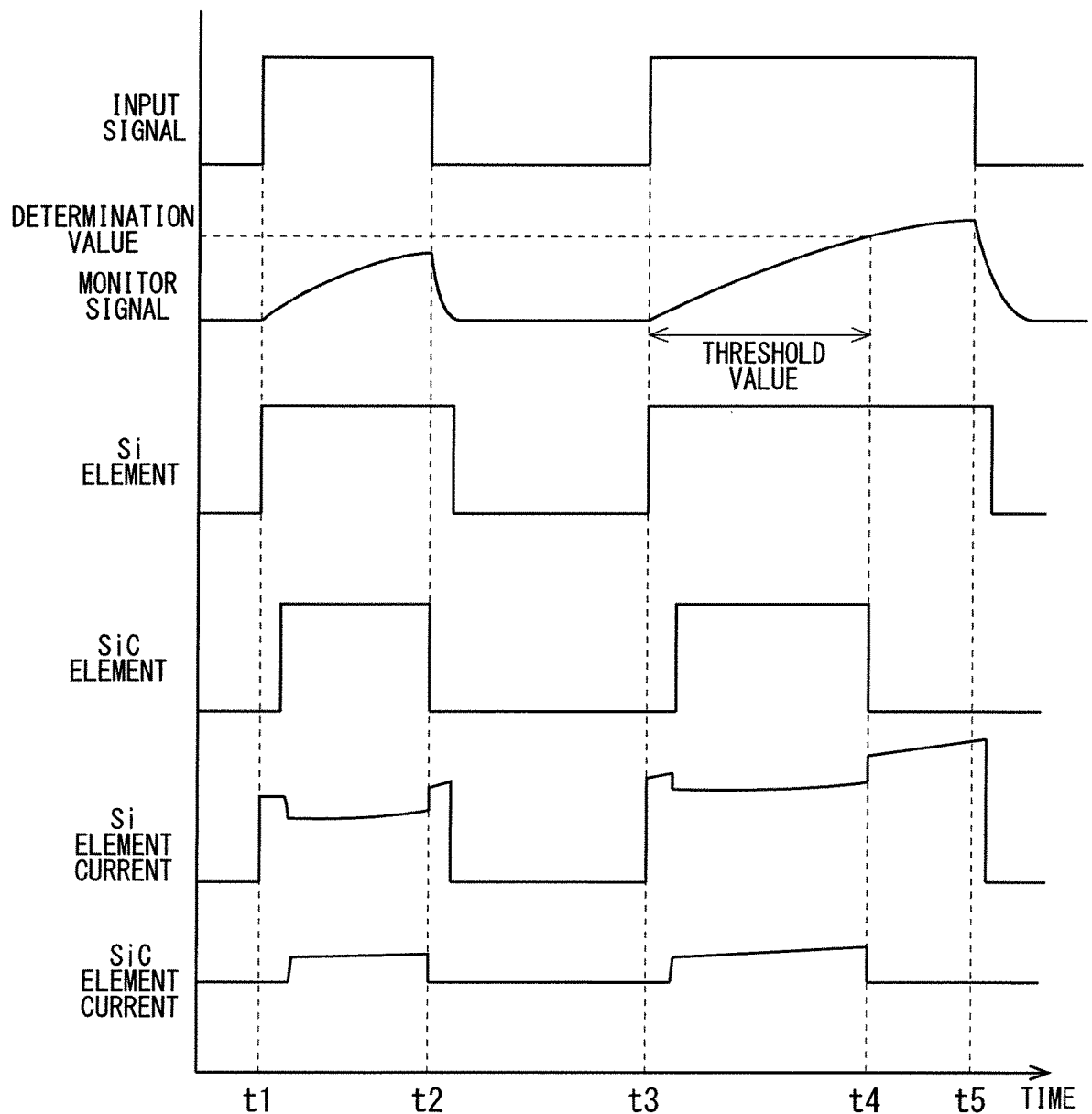
FIG. 5 is a timing chart illustrating an operation of the semiconductor device according to the embodiment 1.

FIG. 5 is a timing chart illustrating an operation of the semiconductor device according to the present embodiment 1. FIG. 5 illustrates input signal, a monitor signal from the time detection circuit 2d, gate voltage of the Si element 1a and the SiC element 1b, current flowing in the collector terminal and the emitter terminal of the Si element 1a, and current flowing in the drain terminal and the source terminal of the SiC element 1b. When the semiconductor device according to the present embodiment 1 is used for an air conditioner, an operation during time t1 to t2 corresponds to a state mainly occurring in an operation state at low current when a room temperature is stable after an elapse of a certain period of time after an activation of the air conditioner, and an operation during time t3 to t5 corresponds to a state which may occur in a case where large current needs to be flowed at a time of starting activation of the air conditioner, for example.

The input signal is switched to ON at the time t1. Thus, the gate drive circuit 2 turns on the Si element 1a, and subsequently turns on the SiC element 1b after a moment. When the Si element 1a and the SiC element 1b are ON, the current flows in the SiC element 1b, and the current in the Si element 1a decreases by the amount of the current in the SiC element 1b. Voltage of the monitor signal increases after the time t1.

The input signal is switched to OFF at the time t2. The time t2 is a time before the voltage of the monitor signal is equal to or larger than a determination value, that is to say, before the ON continuing time is equal to or larger than a threshold value. Thus, the gate drive circuit 2 turns off the SiC element 1b, and subsequently turns off the Si element 1a after a moment. When the Si element 1a is ON and the SiC element 1b is OFF, the current is suspended in the SiC element 1b, and the current in the Si element 1a increases by the amount of the current in the SiC element 1b.

The input signal is switched to ON at the time t3, and the operation similar to that at the time t1 is performed. The voltage of the monitor signal increases after the time t3. The input signal keeps ON at the time t4. The time t4 is a time at which the voltage of the monitor signal is equal to or larger than the determination value, that is to say, a time at which the ON continuing time is equal to or larger than the threshold value. Thus, the gate drive circuit 2 keeps ON of the Si element 1a, but turns off the SiC element 1b. When the Si element 1a is ON and the SiC element 1b is OFF, the current is suspended in the SiC element 1b, and the current in the Si element 1a increases by the amount of the current in the SiC element 1b.

The input signal is switched to OFF at the time t5. Thus, the gate drive circuit 2 turns off the Si element 1a after a moment. In this manner, when the ON continuing time is equal to or larger than the threshold value, the gate drive circuit 2 increases a time between a timing of turning off the Si element 1a and a timing of turning off the SiC element 1b.

Outline of Embodiment 1

According to the semiconductor device in the present embodiment 1 described above, when the ON continuing time is equal to or larger than the threshold value, the gate drive circuit 2 turns off the SiC element 1b while keeping ON of the Si element 1a. According to such a configuration, a power conduction time of the SiC element 1b can be restricted, thus heat occurring by the power conduction of the SiC element 1b can be suppressed without providing a temperature detection circuit and a current detection circuit. As a result, a defect of the SiC element 1b due to the heat can be suppressed.

In the present embodiment 1, the gate drive circuit 2 turns on the SiC element 1b after turning on the Si element 1a, and turns off the Si element 1a after turning off the SiC element 1b. According to such a configuration, the Si element 1a is firstly turned on at the time of turning on the parallel circuit, thus prevented is a state where the current wholly flows in the small-sized SiC element 1b, and the defect of the SiC element 1b due to the heat can be suppressed.

The above configuration is particularly effective when the SiC element 1b has a small size and the SiC element 1b has fine DC characteristics, and is particularly effective for a semiconductor device for a home electrical appliance such as a hone air-conditioner strongly requiring reduction of cost, for example.

The buffer circuit 2a may output a signal in which the logical value of the input signal is reversed. In that case, it is sufficient to perform the operation similar to that described above by reversing the input signal by a reverse circuit not shown in the diagrams.

Embodiment 2

FIG. 6 is a diagram illustrating a configuration of the semiconductor device according to the present embodiment 2, and is specifically a diagram illustrating configurations of the parallel circuit 1 and the gate drive circuit 2 according to the present embodiment 2 in detail. The configuration in FIG. 6 is similar to the configuration in FIG. 4 except that a voltage adjustment circuit 2f as a logic circuit is added.

The comparator 2e outputs the output signal, which is different between a case where the ON continuing time is equal to or larger than the threshold value and a case where the ON continuing time is not equal to or larger than the threshold value, to the voltage adjustment circuit 2f.

The voltage adjustment circuit 2*f* controls the buffer circuit 2*c* when receiving the output signal in the case where the ON continuing time is equal to or larger than the threshold value, thereby reducing the gate voltage in the SiC element 1*b* within a range equal to or larger than threshold value voltage in the SiC element 1*b*. Accordingly, ON of the SiC element 1*b* is kept, however, a power conduction capability of the SiC element 1*b* decreases.

The control circuit 2*b* keeps ON of the Si element 1*a* and the SiC element 1*b* as long as the input signal is not turned off regardless of the ON continuing time.

Figure 7:
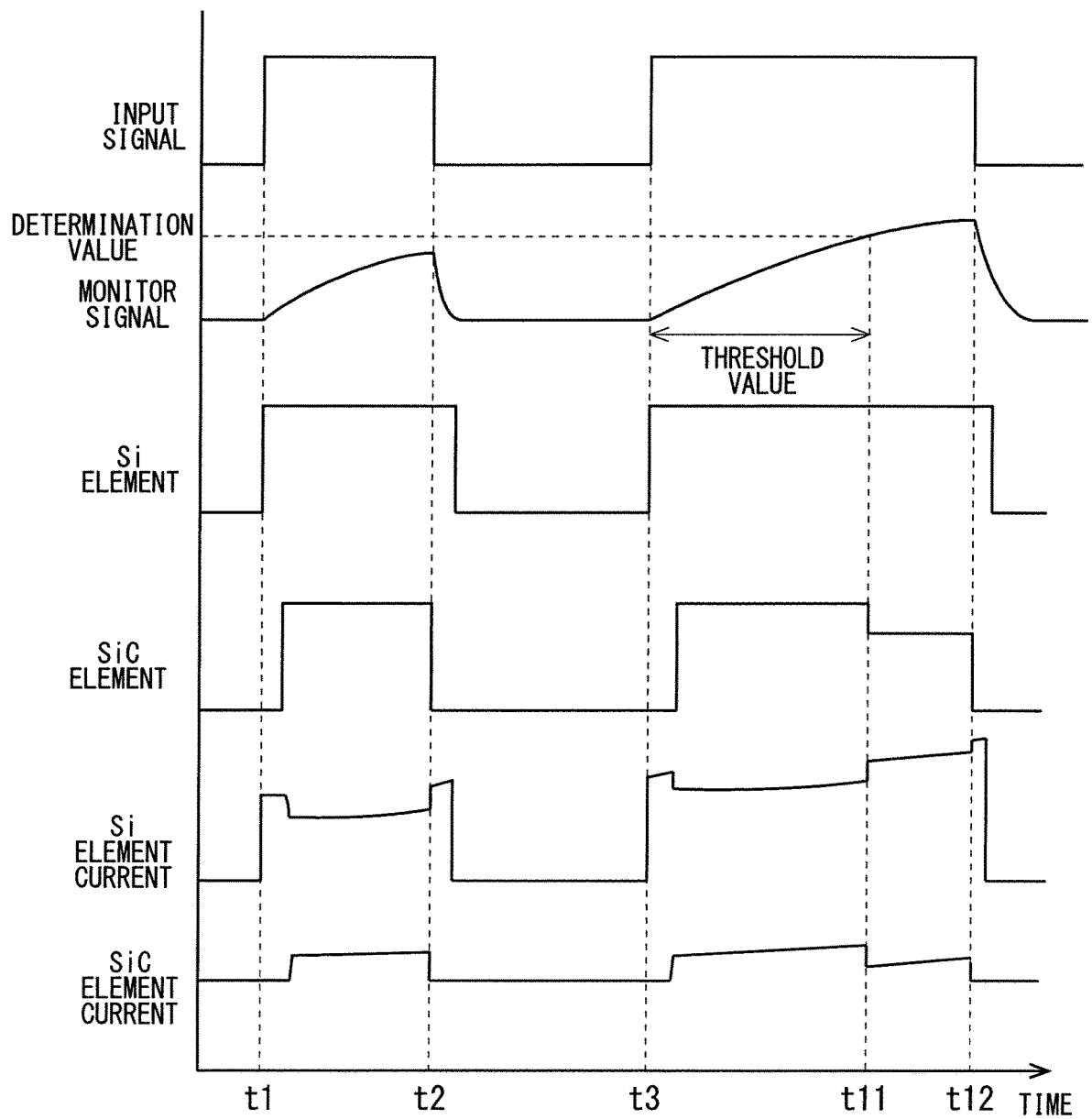
FIG. 7 is a timing chart illustrating an operation of the semiconductor device according to the embodiment 2.

FIG. 7 is a timing chart illustrating an operation of the semiconductor device according to the present embodiment 2. An operation during the time t1 to t3 in FIG. 7 is similar to that during the time t1 to t3 in FIG. 5, thus an operation at a time t11 and a time t12 in FIG. 7 is described hereinafter.

The input signal keeps ON at the time t11. The time t11 is a time at which the voltage of the monitor signal is equal to or larger than a determination value, that is to say, a time at which the ON continuing time is equal to or larger than a threshold value. Thus, the gate drive circuit 2 keeps ON of the Si element 1*a* and the SiC element 1*b*, but reduces the power conduction capability of the SiC element 1*b*. When the power conduction capability of the SiC element 1*b* is low, the current flowing in the SiC element 1*b* decreases, and the current in the Si element 1*a* increases by the amount of the current in the SiC element 1*b*.

The input signal is switched to OFF at the time t12. Thus, the gate drive circuit 2 turns off the SiC element 1*b*, and subsequently turns off the Si element 1*a* after a moment. When the Si element 1*a* is ON and the SiC element 1*b* is OFF, the current is suspended in the SiC element 1*b*, and the current in the Si element 1*a* increases by the amount of the current in the SiC element 1*b*.

Outline of Embodiment 2

According to the semiconductor device in the present embodiment 2 described above, when the ON continuing time is equal to or larger than the threshold value, the gate drive circuit 2 reduces the power conduction capability of the SiC element 1*b* while keeping ON of the Si element 1*a*. According to such a configuration, the power conduction capability of the SiC element 1*b* can be restricted, thus the heat occurring by the power conduction of the SiC element 1*b* can be suppressed without providing the temperature detection circuit and the current detection circuit. As a result, a defect of the SiC element 1*b* due to the heat can be suppressed. The configuration of the present embodiment 2 has a lower capacity of suppressing the defect of the SiC element 1*b* due to the heat than the configuration according to the embodiment 1, but can improve efficiency (that is to say, reduction of loss).

Embodiment 3

Figure 8:
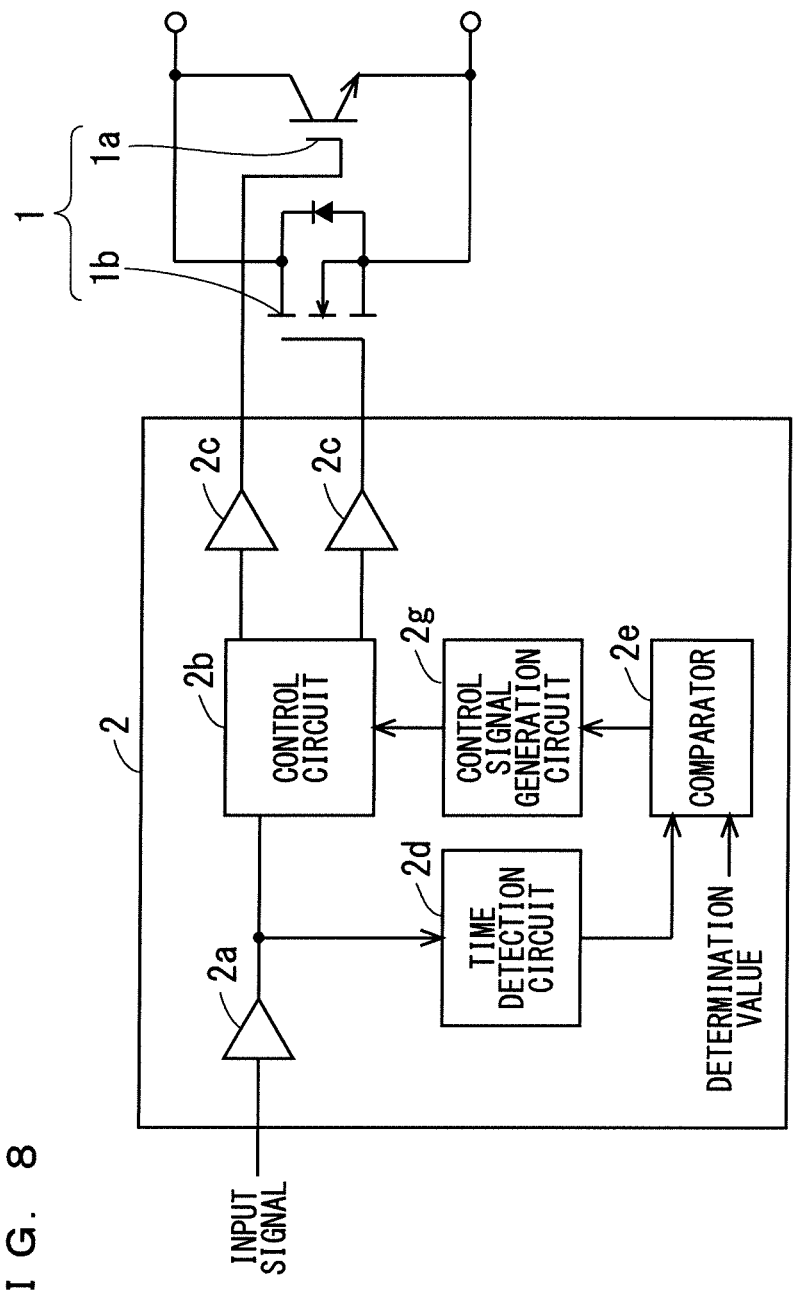
FIG. 8 is a diagram illustrating a configuration of a semiconductor device according to an embodiment 3.

FIG. 8 is a diagram illustrating a configuration of a semiconductor device according to the present embodiment 3, and is specifically a diagram illustrating configurations of the parallel circuit 1 and the gate drive circuit 2 according to the present embodiment 3 in detail. The configuration in FIG. 8 is similar to the configuration in FIG. 4 except that a control signal generation circuit 2*g* as a logic circuit is added.

The comparator 2*e* outputs the output signal, which is different between a case where the ON continuing time is equal to or larger than the threshold value and a case where the ON continuing time is not equal to or larger than the threshold value, to the control signal generation circuit 2*g*.

The control signal generation circuit 2*g* outputs a control signal for the control circuit 2*b* to repeat ON and OFF of the SiC element 1*b* in a short time to the control circuit 2*b* when receiving the output signal in the case where the ON continuing time is equal to or larger than the threshold value from the comparator 2*e*.

The control circuit 2*b* repeats ON and OFF of the SiC element 1*b* in a short time while keeping ON of the Si element 1*a* when receiving the control signal from the control signal generation circuit 2*g* as long as the input signal is not turned off.

Figure 9:
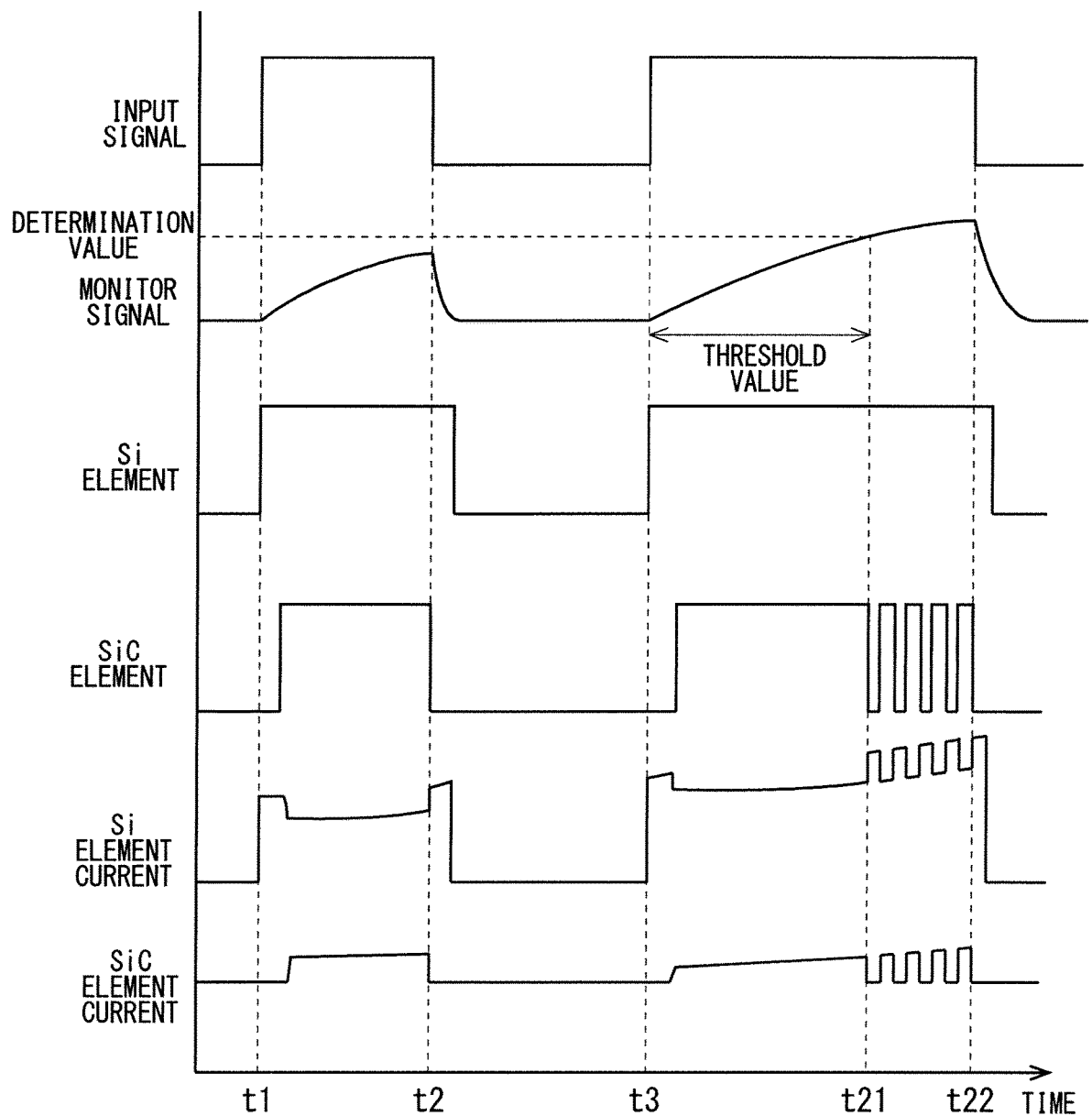
FIG. 9 is a timing chart illustrating an operation of the semiconductor device according to the embodiment 3.

FIG. 9 is a timing chart illustrating an operation of the semiconductor device according to the present embodiment 3. An operation during the time t1 to t3 in FIG. 9 is similar to that during the time t1 to t3 in FIG. 5, thus an operation at a time t21 and a time t22 in FIG. 9 is described hereinafter.

The input signal keeps ON at the time t21. The time t21 is a time at which the voltage of the monitor signal is equal to or larger than a determination value, that is to say, a time at which the ON continuing time is equal to or larger than a threshold value. Thus, the gate drive circuit 2 repeats ON and OFF of the SiC element 1*b* in a short time while keeping ON of the Si element 1*a*. When the SiC element 1*b* is ON, the current flows in the SiC element 1*b*, and the current in the Si element 1*a* decreases by the amount of the current in the SiC element 1*b*. When the SiC element 1*b* is OFF, the current is suspended in the SiC element 1*b*, and the current in the Si element 1*a* increases by the amount of the current in the SiC element 1*b*.

The input signal is switched to OFF at the time t22. Thus, the gate drive circuit 2 turns off the SiC element 1*b*, and subsequently turns off the Si element 1*a* after a moment.

Outline of Embodiment 3

According to the semiconductor device in the present embodiment 3 described above, when the ON continuing time is equal to or larger than the threshold value, the gate drive circuit 2 repeats ON and OFF of the SiC element 1*b* while keeping ON of the Si element 1*a*. According to such a configuration, a power conduction time of the SiC element 1*b* can be restricted, thus heat occurring by the power conduction of the SiC element 1*b* can be suppressed without providing a temperature detection circuit and a current detection circuit. As a result, a defect of the SiC element 1*b* due to the heat can be suppressed. The configuration of the present embodiment 3 has a lower capacity of suppressing the defect of the SiC element 1*b* due to the heat than the configuration according to the embodiment 1, but can improve efficiency (that is to say, reduction of loss). Simplification of the circuit can be expected according to the configuration in the present embodiment 3 more than that in the embodiment 2.

Embodiment 4

Figure 10:
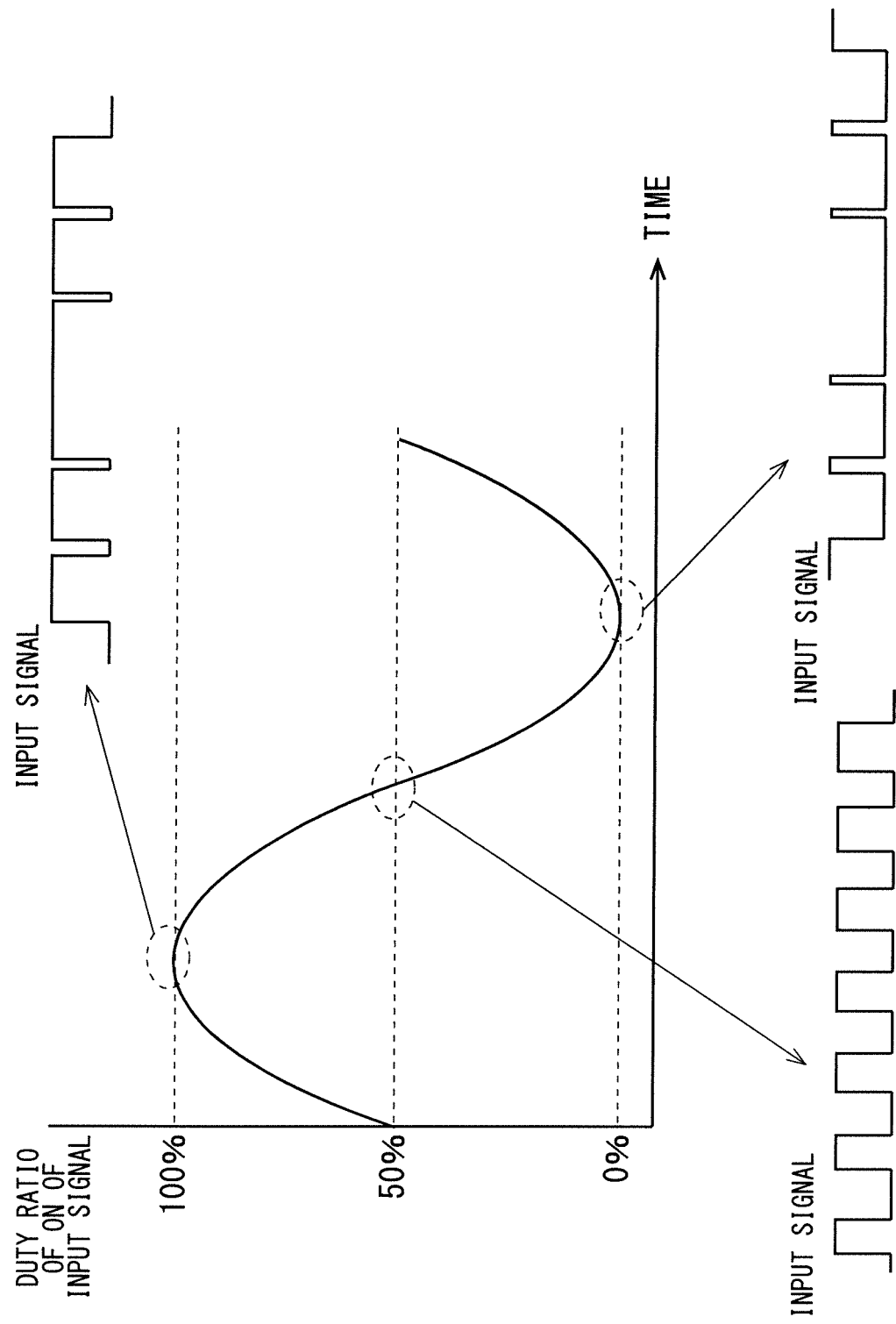
FIG. 10 is a diagram illustrating an example of an input signal.

When the semiconductor device is used for a motor-driving inverter device, pulse width modulation (PWM) substantially flowing sine-wave current to a motor is performed, thus the ON continuing time of the input signal is continuously variable as illustrated in FIG. 10. In this case, the ON continuing time of ON adjacent to each other in the input signal is substantially the same as each other, thus when a duty ratio of ON of the input signal is close to 100%, and a protection state of suppressing the heat of the SiC element 1b occurs in a certain ON, the protection state also occurs in the next ON in many cases. Thus, as described hereinafter, a semiconductor device according to the present embodiment 4 has a configuration capable of continuing the protection state also in the next ON when the protection state occurs in the certain ON.

Figure 11:
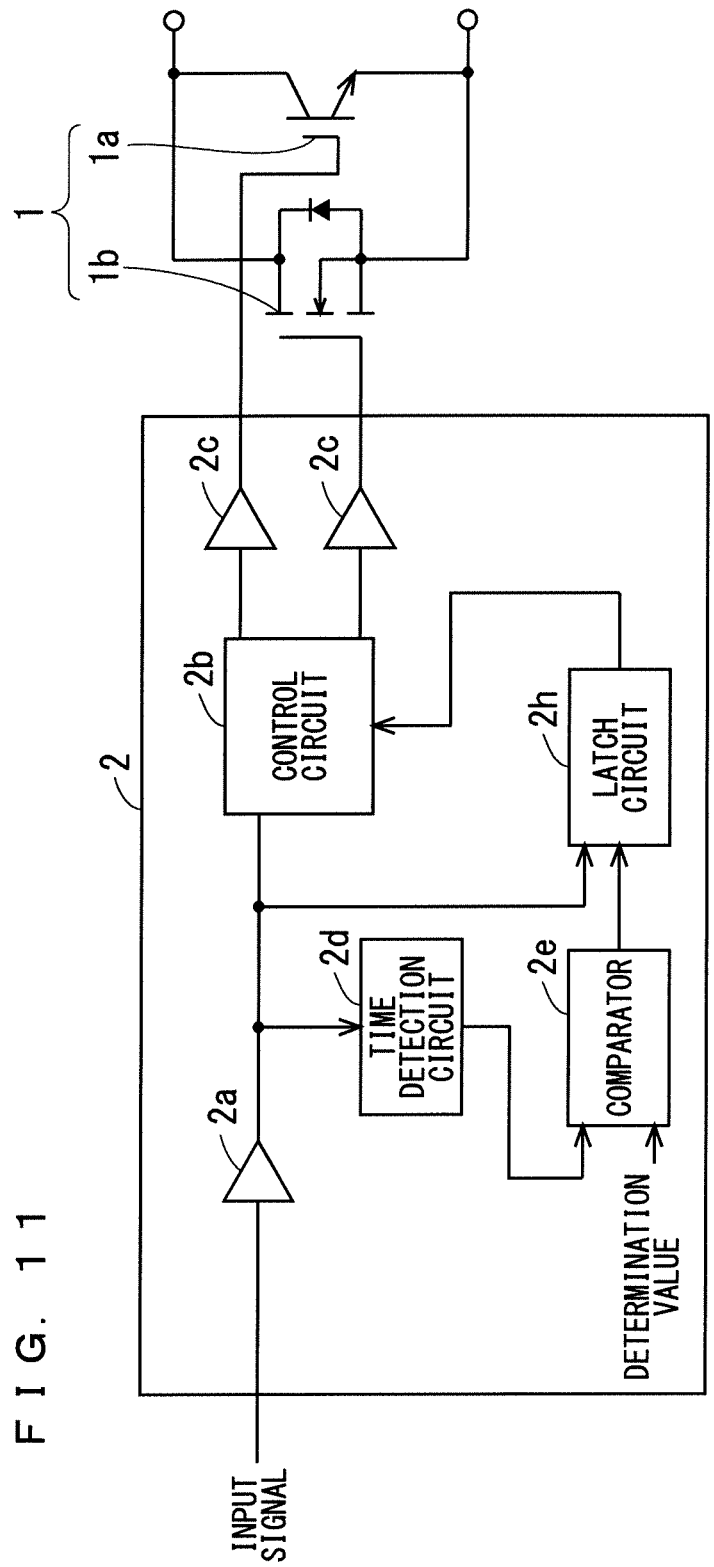
FIG. 11 is a diagram illustrating a configuration of a semiconductor device according to an embodiment 4.

FIG. 11 is a diagram illustrating a configuration of the semiconductor device according to the present embodiment 4, and is specifically a diagram illustrating configurations of the parallel circuit 1 and the gate drive circuit 2 according to the present embodiment 4 in detail. The configuration in FIG. 11 is similar to the configuration in FIG. 4 except that a latch circuit 2h as a logic circuit is added.

The comparator 2e outputs the output signal, which is different between a case where the ON continuing time is equal to or larger than the threshold value and a case where the ON continuing time is not equal to or larger than the threshold value, to the latch circuit 2h.

When the latch circuit 2h receives the output signal of ON from the comparator 2e in a case where the ON continuing time is equal to or larger than the threshold value, the latch circuit 2h outputs a latch signal of ON to the control circuit 2b. After the latch circuit 2h outputs the latch signal of ON to the control circuit 2b, the latch circuit 2h continues outputting the latch signal of ON to the control circuit 2b until receiving switching of the input signal to OFF and the output signal of OFF from the comparator 2e.

When the input signal is switched to ON during a period in which the control circuit 2b receives the latch signal of ON from the latch circuit 2h, the control circuit 2b turns on the Si element 1a, but does not turn on the SiC element 1b. Other than the above configuration, the control circuit 2b performs the operation similar to that of the control circuit 2b according to the embodiment 1.

Figure 12:
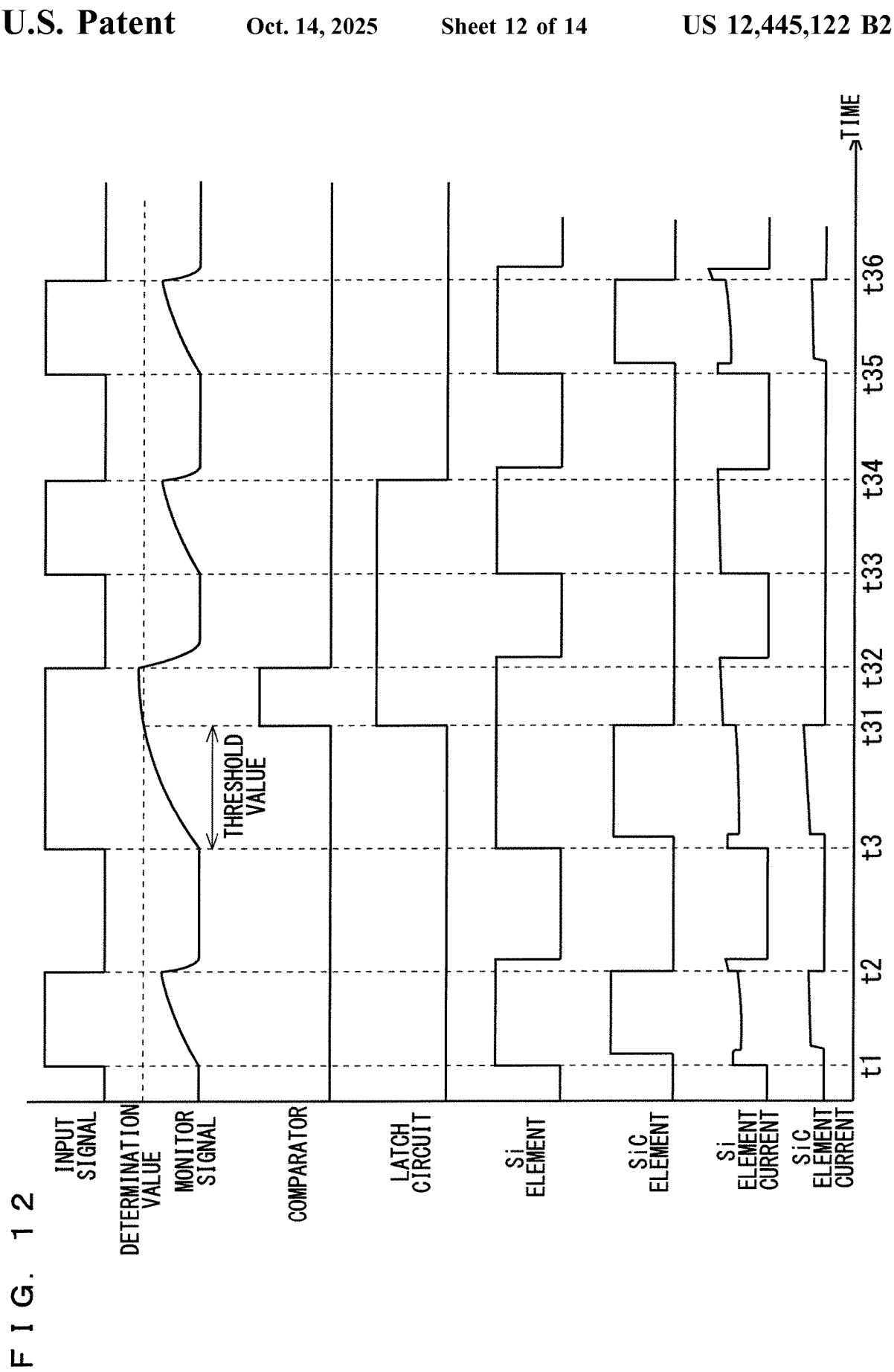
FIG. 12 is a timing chart illustrating an operation of the semiconductor device according to the embodiment 4.

FIG. 12 is a timing chart illustrating an operation example of the semiconductor device according to the present embodiment 4. An operation during the time t1 to t3 in FIG. 12 is similar to that during the time t1 to t3 in FIG. 5, thus an operation at a time t31 to t36 in FIG. 12 is described hereinafter.

The input signal keeps ON at the time t31. The time t31 is a time at which the voltage of the monitor signal is equal to or larger than a determination value, that is to say, a time at which the ON continuing time is equal to or larger than a threshold value. Thus, the gate drive circuit 2 keeps ON of the Si element 1a, but turns off the SiC element 1b. The comparator 2e outputs the output signal of ON to the latch circuit 2h, and the latch circuit 2h outputs the latch signal of ON to the control circuit 2b.

The input signal is switched to OFF at the time t32. Thus, the gate drive circuit 2 turns off the Si element 1a after a moment.

The input signal is switched to ON at the time t33. At this point of time, the latch circuit 2h outputs the latch signal of ON to the control circuit 2b, thus the gate drive circuit 2 does not turn on the SiC element 1b, but turns on the Si element 1a.

The input signal is switched to OFF at the time t34. Thus, the gate drive circuit 2 turns off the Si element 1a after a moment. The time t34 is a time before the voltage of the monitor signal is equal to or larger than a determination value, that is to say, before the ON continuing time is equal to or larger than a threshold value. Thus, the comparator 2e outputs the output signal of OFF to the latch circuit 2h, and the latch circuit 2h receives switching of the input signal to OFF and the output signal of OFF from the comparator 2e, thus the latch circuit 2h outputs the latch signal of OFF to the control circuit 2b.

Accordingly, a state where the latch signal from the latch circuit 2h to the control circuit 2b is ON is canceled, and the normal operation similar to that during the time t1 to t2, that is to say, the operation of turning on the SiC element 1b is performed during the time t35 to t36. Described above is the case where the continuing time of the input signal is smaller than the threshold value during the time t33 to t34. When the continuing time of the input signal is equal to or larger than the threshold value during the time t33 to t34, the operation similar to that at the time t31 and the time t32 is performed after the time t33.

Outline of Embodiment 4

According to the semiconductor device in the present embodiment 4 described above, when the ON continuing time is equal to or larger than the threshold value, the gate drive circuit 2 keeps OFF of the SiC element 1b on a next ON of the input signal. According to such a configuration, the heat of the SiC element 1b can be effectively suppressed.

Embodiment 5

Figure 13:
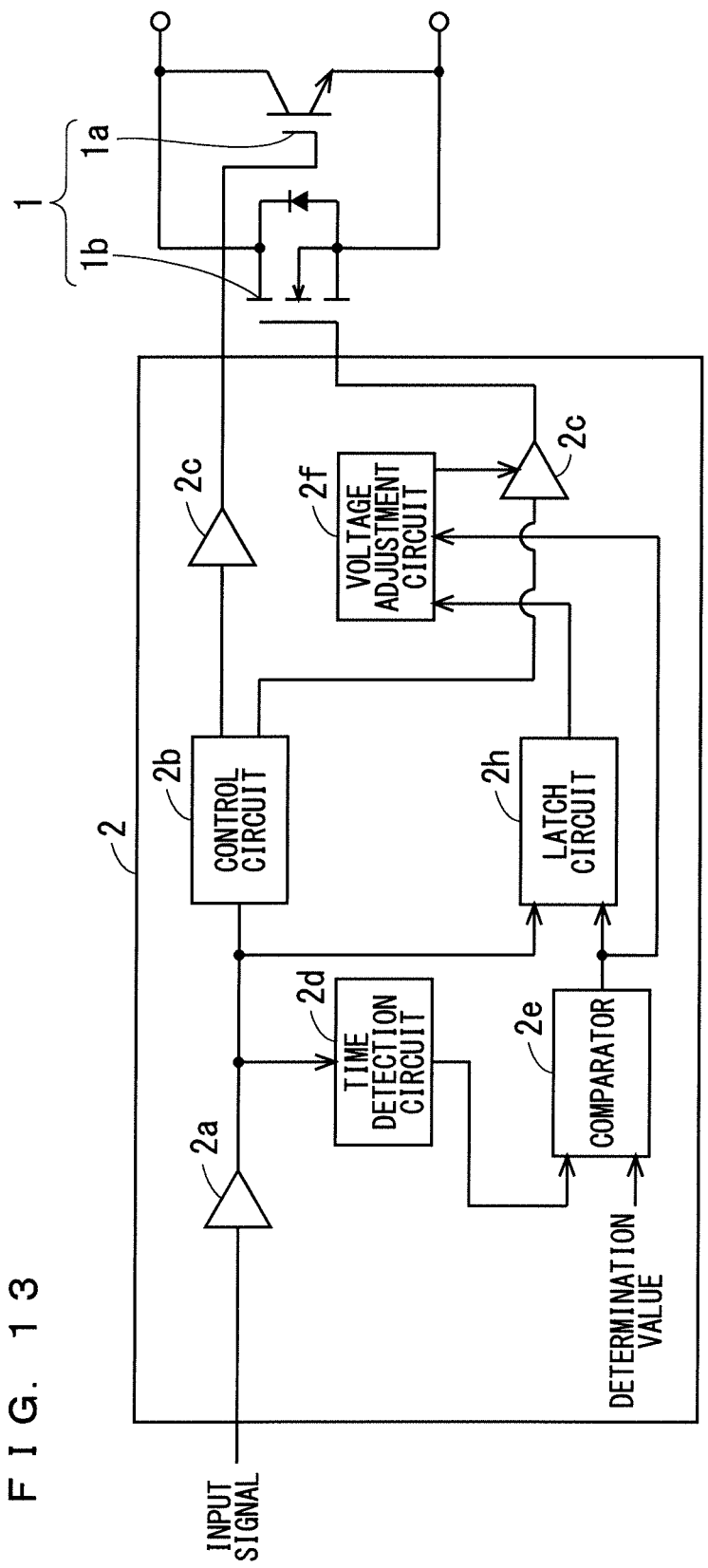
FIG. 13 is a diagram illustrating a configuration of a semiconductor device according to an embodiment 5.

FIG. 13 is a diagram illustrating a configuration of the semiconductor device according to the present embodiment 5, and is specifically a diagram illustrating configurations of the parallel circuit 1 and the gate drive circuit 2 according to the present embodiment 5 in detail. The configuration in FIG. 13 is similar to that in FIG. 4 except that the voltage adjustment circuit 2f described in the embodiment 2 and the latch circuit 2h described in the embodiment 4 are added.

The comparator 2e outputs the output signal, which is different between a case where the ON continuing time is equal to or larger than the threshold value and a case where the ON continuing time is not equal to or larger than the threshold value, to the latch circuit 2h and the voltage adjustment circuit 2f.

When the latch circuit 2h receives the output signal of ON from the comparator 2e in a case where the ON continuing time is equal to or larger than the threshold value, the latch circuit 2h outputs a latch signal of ON to the voltage adjustment circuit 2f. After the latch circuit 2h outputs the latch signal of ON to the voltage adjustment circuit 2f, the latch circuit 2h continues outputting the latch signal of ON to the voltage adjustment circuit 2f until receiving switching of the input signal to OFF and the output signal of OFF from the comparator 2e.

The voltage adjustment circuit 2f controls the buffer circuit 2c during receiving the latch signal of ON from the latch circuit 2h, thereby reducing the gate voltage in the SiC element 1b within a range equal to or larger than threshold value voltage in the SiC element 1b. Other than the above configuration, the voltage adjustment circuit 2f performs the operation similar to that of the voltage adjustment circuit 2f according to the embodiment 2.

FIG. 14 is a timing chart illustrating an operation example of the semiconductor device according to the present embodiment 5. An operation during the time t1 to t3 in FIG. 14 is similar to that during the time t1 to t3 in FIG. 5, thus an operation at a time t41 to t46 in FIG. 14 is described hereinafter.

The input signal keeps ON at the time t41. The time t41 is a time at which the voltage of the monitor signal is equal to or larger than a determination value, that is to say, a time at which the ON continuing time is equal to or larger than a threshold value. Thus, the gate drive circuit 2 keeps ON of the Si element 1*a*, but reduces the power conduction capability of the SiC element 1*b*. The comparator 2*e* outputs the output signal of ON to the latch circuit 2*h*, and the latch circuit 2*h* outputs the latch signal of ON to the voltage adjustment circuit 2*f*.

The input signal is switched to OFF at the time t42. Thus, the gate drive circuit 2 turns off the SiC element 1*b*, and subsequently turns off the Si element 1*a* after a moment.

The input signal is switched to ON at the time t43. At this point of time, the latch circuit 2*h* outputs the latch signal of ON to the voltage adjustment circuit 2*f*, thus the gate drive circuit 2 keeps ON of the Si element 1*a* and the SiC element 1*b*, but reduces the power conduction capability of the SiC element 1*b*.

The input signal is switched to OFF at the time t44. Thus, the gate drive circuit 2 turns off the SiC element 1*b*, and subsequently turns off the Si element 1*a* after a moment. The time t44 is a time before the voltage of the monitor signal is equal to or larger than a determination value, that is to say, before the ON continuing time is equal to or larger than a threshold value. Thus, the comparator 2*e* outputs the output signal of OFF to the latch circuit 2*h*, and the latch circuit 2*h* receives switching of the input signal to OFF and the output signal of OFF from the comparator 2*e*, thus the latch circuit 2*h* outputs the latch signal of OFF to the voltage adjustment circuit 2*f*.

Accordingly, a state where the latch signal from the latch circuit 2*h* to the voltage adjustment circuit 2*f* is ON is canceled, and the normal operation similar to that during the time t1 to t2, that is to say, the operation of the SiC element 1*b* in an original power conduction capability is performed during the time t45 to t46. Described above is the case where the continuing time of the input signal is smaller than the threshold value during the time t43 to t44. When the continuing time of the input signal is equal to or larger than the threshold value during the time t43 to t44, the operation similar to that at the time t41 and the time t42 is performed after the time t43.

Outline of Embodiment 5

According to the semiconductor device in the present embodiment 5 described above, when the ON continuing time is equal to or larger than the threshold value, the gate drive circuit 2 reduces the power conduction capability of the SiC element 1*b* on a next ON of the input signal. According to such a configuration, the heat of the SiC element 1*b* can be effectively suppressed.

Each embodiment and each modification example can be arbitrarily combined, or each embodiment and each modification can be appropriately varied or omitted.

The aspects of the present disclosure are collectively described hereinafter as appendixes.

(Appendix 1)
A semiconductor device, comprising:
a parallel circuit in which a first semiconductor switching element and a second semiconductor switching element having a larger bandgap than the first semiconductor switching element are parallelly connected; and
a gate drive circuit capable of changing a time of continuing a state of ON of the first semiconductor switching element and the second semiconductor switching element based on the state of ON or OFF of an input signal, wherein
when a state continuing time which is a time during which the state of the input signal continues is equal to or larger than a threshold value, the gate drive circuit turns off the second semiconductor switching element while keeping ON of the first semiconductor switching element, or reduces a power conduction capability of the second semiconductor switching element while keeping ON of the first semiconductor switching element.

(Appendix 2)
The semiconductor device according to Appendix 1, wherein
the gate drive circuit turns on the second semiconductor switching element after turning on the first semiconductor switching element, and turns off the first semiconductor switching element after turning off the second semiconductor switching element.

(Appendix 3)
The semiconductor device according to Appendix 1 or 2, wherein
when the state continuing time is equal to or larger than the threshold value, the gate drive circuit repeats ON and OFF of the second semiconductor switching element while keeping ON of the first semiconductor switching element.

(Appendix 4)
The semiconductor device according to Appendix 1 or 2, wherein
when the state continuing time is equal to or larger than the threshold value, the gate drive circuit keeps OFF of the second semiconductor switching element or reduces the power conduction capability of the second semiconductor switching element on the state, which subsequently occurs, of the input signal.

(Appendix 5)
The semiconductor device according to any one of Appendixes 1 to 4, wherein
the first semiconductor switching element is an IGBT made of silicon, and
the second semiconductor switching element is a MOSFET made of silicon carbide.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device, comprising:
a parallel circuit in which a first semiconductor switching element and a second semiconductor switching element having a larger bandgap than the first semiconductor switching element are parallelly connected; and
a gate drive circuit capable of changing a time of continuing a state of ON of the first semiconductor switching element and the second semiconductor switching element based on the state of ON or OFF of an input signal, wherein
when a state continuing time which is a time during which the state of the input signal continues is equal to or larger than a threshold value, the gate drive circuit turns off the second semiconductor switching element while keeping ON of the first semiconductor switching element, or reduces a power conduction capability of the second semiconductor switching element while keeping ON of the first semiconductor switching element.

2. The semiconductor device according to claim 1, wherein
the gate drive circuit turns on the second semiconductor switching element after turning on the first semiconductor switching element, and turns off the first semiconductor switching element after turning off the second semiconductor switching element.

3. The semiconductor device according to claim 1, wherein
when the state continuing time is equal to or larger than the threshold value, the gate drive circuit repeats ON and OFF of the second semiconductor switching element while keeping ON of the first semiconductor switching element.

4. The semiconductor device according to claim 1, wherein
when the state continuing time is equal to or larger than the threshold value, the gate drive circuit keeps OFF of the second semiconductor switching element or reduces the power conduction capability of the second semiconductor switching element on the state, which subsequently occurs, of the input signal.

5. The semiconductor device according to claim 1, wherein
the first semiconductor switching element is an IGBT made of silicon, and
the second semiconductor switching element is a MOSFET made of silicon carbide.

6. The semiconductor device according to claim 2, wherein
when the state continuing time is equal to or larger than the threshold value, the gate drive circuit repeats ON and OFF of the second semiconductor switching element while keeping ON of the first semiconductor switching element.

7. The semiconductor device according to claim 2, wherein
when the state continuing time is equal to or larger than the threshold value, the gate drive circuit keeps OFF of the second semiconductor switching element or reduces the power conduction capability of the second semiconductor switching element on the state, which subsequently occurs, of the input signal.

8. The semiconductor device according to claim 2, wherein
the first semiconductor switching element is an IGBT made of silicon, and
the second semiconductor switching element is a MOSFET made of silicon carbide.

* * * * *